United States Patent
Webster

(10) Patent No.: US 9,082,675 B2
(45) Date of Patent: Jul. 14, 2015

(54) PARTITIONED SILICON PHOTOMULTIPLIER WITH DELAY EQUALIZATION

(71) Applicant: OMNIVISION TECHNOLOGIES, INC., Santa Clara, CA (US)

(72) Inventor: Eric A. G. Webster, Cathart (GB)

(73) Assignee: OmniVision Technoloigies, Inc., Santa Clara, CA (US)

( * ) Notice: Subject to any disclaimer, the term of this patent is extended or adjusted under 35 U.S.C. 154(b) by 215 days.

(21) Appl. No.: 13/964,987

(22) Filed: Aug. 12, 2013

(65) Prior Publication Data

US 2015/0041627 A1    Feb. 12, 2015

(51) Int. Cl.
*H01L 27/144*    (2006.01)
*H01L 27/146*    (2006.01)

(52) U.S. Cl.
CPC ........ *H01L 27/14634* (2013.01); *H01L 27/144* (2013.01)

(58) Field of Classification Search
CPC ........................ H01L 27/144; H01L 27/14634
See application file for complete search history.

(56) References Cited

U.S. PATENT DOCUMENTS

| 8,476,571 B2 | 7/2013 | Grazioso et al. | |
|---|---|---|---|
| 2010/0316184 A1* | 12/2010 | Iwanczyk et al. | 378/19 |
| 2011/0084212 A1* | 4/2011 | Clark | 250/370.08 |
| 2013/0099100 A1* | 4/2013 | Pavlov | 250/208.2 |

FOREIGN PATENT DOCUMENTS

| WO | WO 2012/019640 A1 | 2/2012 |
|---|---|---|
| WO | WO 2013/021175 A2 | 2/2013 |

OTHER PUBLICATIONS

Webster, E.A.G., et al., "A silicon photomultiplier with >30% detection efficiency from 450-750nm and 11.6μm pitch NMOS-only pixel with 21.6% fill factor in 130nm CMOS," *Solid-State Device Research Conference ( ESSDERC), 2012 Proceedings of the European* , pp. 238-241, Sep. 2012.

TW Application No. 102145668—Taiwanese Office Action and Search Report, with English Translation, issued Nov. 12, 2014 (9 pages).

* cited by examiner

*Primary Examiner* — Tony Ko
(74) *Attorney, Agent, or Firm* — Blakely Sokoloff Taylor & Zafman LLP

(57) ABSTRACT

A photon detection device includes a first wafer having an array of photon detection cells partitioned into a plurality of photon detection blocks arranged in the first wafer. A second wafer having a plurality of block readout circuits arranged thereon is also included. An interconnect wafer is disposed between the first wafer and the second wafer. The interconnect wafer includes a plurality of conductors having substantially equal lengths. Each one of the plurality of conductors is coupled between a corresponding one of the plurality of photon detection blocks in the first wafer and a corresponding one of the plurality of block readout circuits such that signal propagation delays between each one of the plurality of photon detection blocks and each one of the plurality of block readout circuits are substantially equal.

22 Claims, 4 Drawing Sheets

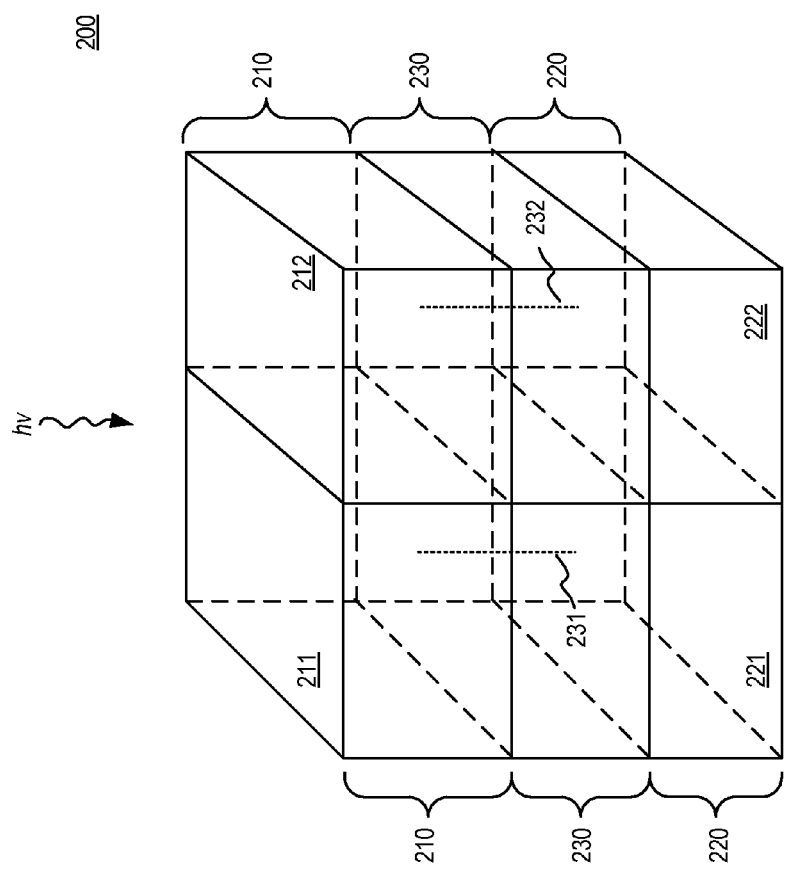

PARTITIONED SILICON PHOTOMULTIPLIER WITH DELAY EQUALIZATION

BACKGROUND INFORMATION

1. Field of the Disclosure

The present invention relates generally to photodetectors, and more specifically, the present invention is directed to silicon photomultipliers.

2. Background

A silicon photomultiplier (SiPM) is one type of photodetector that is capable of detecting a low intensity signal, as low as a single photon. SiPM devices can be used in a variety of applications including for example detecting ionizing radiation or scillintation. SiPMs are semiconductor photosensitive devices made up of an array of Geiger-mode photon detection cells such as avalanche photodiodes (APDs) that are fabricated on a silicon substrate. Geiger-mode APDs produce a pulse of the same amplitude when struck by a photon. They have a p-n junction that is biased above the breakdown voltage such that each electron-hole pair can trigger an avalanche multiplication process that causes current at the output of the photon detection cell to reach its final value quickly. This avalanche current continues until a quenching element is used to quench the avalanche process. Each photo detection cell is an individual photon counter and all photon detection cells are connected in parallel. The output of the SiPM is the sum of all the photon detection cells processed by a readout circuit and is proportional to the input photon pulse.

There are many factors that may affect the timing resolution of a SiPM. As the physical sizes of the photosensitive devices in the array of photon detection cells in the SiPM increase, the different signal propagation delays caused by the different distances between the photon detection cells in the SiPM and the readout circuit cause unwanted skewing, which degrades the timing resolution.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2 is a three-dimensional image showing the placement of an example stacked-chip SiPM with delay equalization in accordance with the teachings of the present invention.

Figure 1A:
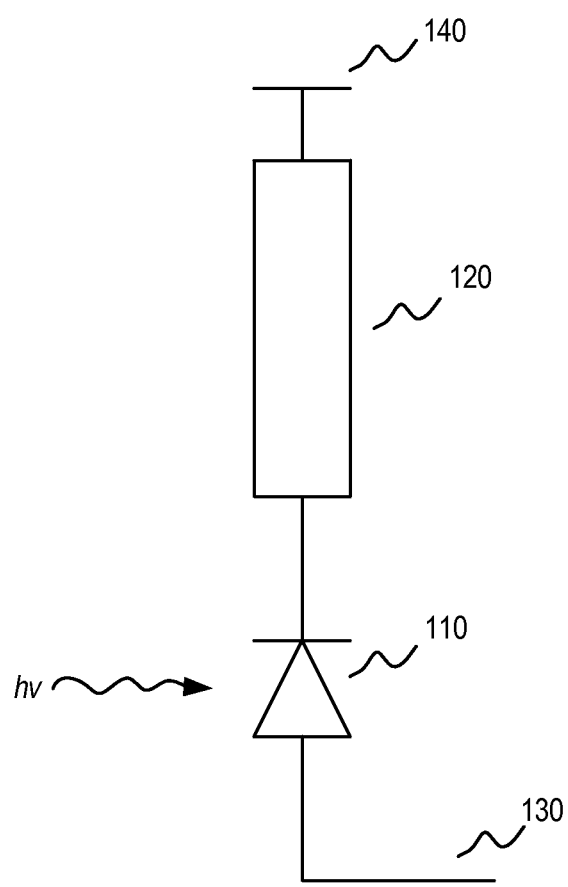
FIG. 1A is a schematic showing an example single photon detection cell in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe a partitioned stacked-chip SiPM with delay equalization. As will be discussed, delay equalization is achieved in accordance with the teachings of the present invention by having a stacked-chip scheme with the array of photon detection cells on a first wafer, the readout circuitry on a second wafer, and an interconnect wafer coupling together the first and second wafers.

For instance, in one example, the array of photon detection cells is partitioned into a plurality of photon detection blocks formed on the first wafer, with each one of the detection blocks being coupled to respective readout circuitry on the second wafer. Each of the plurality of photon detection blocks includes a plurality of photon detection cells, each of which may include a Geiger-mode avalanche photodiode (APD) or a single photon avalanche diode (SPAD). The outputs of the photon detection cells in each photon detection block are connected together in parallel. Each photon detection block output represents the sum of the outputs of the photon detection cells within each photon detection block. A plurality of block readout circuits is included in the second wafer and each block readout circuit is coupled to a respective photon detection block output. The length of the metal interconnects between the outputs of each photon detection cell in a photon detection block and the inputs of the block readout circuits is the substantially equal, which substantially equalizes signal propagation delays and reduces skewing in accordance with the teachings of the present invention. In one example, an interconnect wafer provides the electrical connections between each of the plurality of block readout circuits and the photon detection block outputs.

To illustrate, FIG. 1A is a schematic showing an example single photon detection cell 100 in accordance with the teachings of the present invention. In one example, photon detection cell 100 includes photon detection region 110 and quenching element 120. Photon detection region 110 is coupled between photon detection cell output 130 and quenching element 120. Quenching element 120 is coupled between photon detection region 110 and power supply 140. In one example, photon detection region 110 is included in a SiPM device, which when exposed to a photon pulse produces avalanche current at the output of photon detection cell 130. The quenching element 120 is used to quench the avalanche process of the photon detection region. In one example, quenching element 120 may include a resistor, resulting in a passive quenching circuit. In other examples, the quenching element 120 may include capacitors, resistors and/or transistors.

Figure 1B:
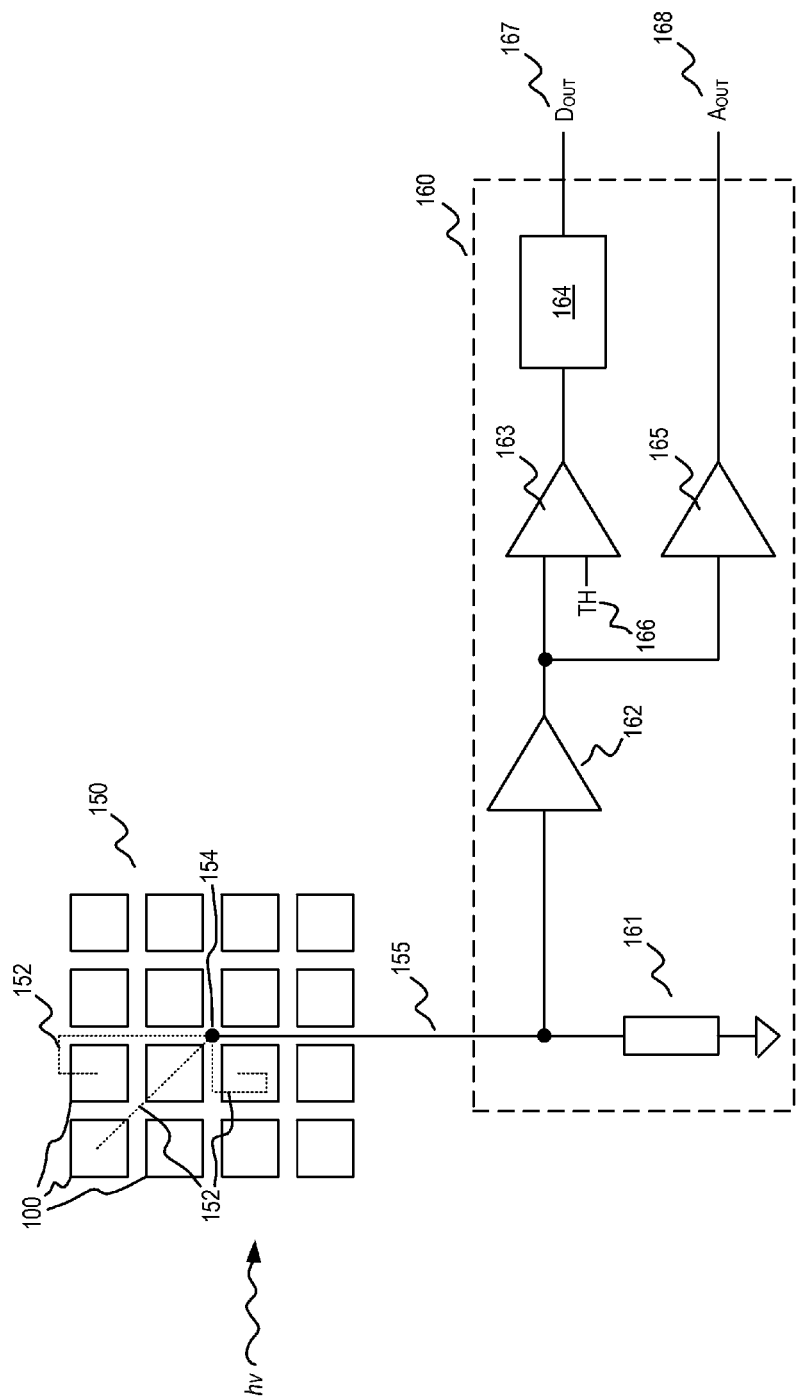
FIG. 1B is a schematic showing an example photon detection block and block readout circuit in accordance with the teachings of the present invention.

FIG. 1B is a schematic showing an example photon detection block 150 coupled to a block readout circuit 160 in accordance with the teachings of the present invention. In the illustrated example, photon detection block 150 is one of a plurality of photon detection blocks that have been partitioned from an array of photon detection cells 100 of a backside illuminated (BSI) wafer in accordance with the teachings of the present invention. As shown in the example, photon detection block 150 includes a plurality of photon detection cells 100. It is noted that the photon detection cells 100 in FIG. 1B may be examples of the photon detection cells 100 of FIG. 1A. It should be appreciated therefore that similarly named and numbered elements referenced below are coupled and function as described above. In one example, the detector cell outputs 130 (as described for example in FIG. 1A) from each photon detection cell 100 of photon detection block 150 are coupled together in parallel through metal interconnects 152 to a micro through silicon via (TSV) 154, which is coupled to an output 155 of photon detection block 150. In one example, each one of the metal interconnects 152 that couple the respective photon detection cell 100 to the output 155 of photon detection block 150 has a substantially equal metal length such that signal propagation delays between the output of each one of the photon detection cells 100 and the photon detection block output 155 are substantially equal.

In the depicted example, each photon detection block 150 is illustrated as including sixteen photon detection cells 100, arranged in a 4×4 array. In other examples, each photon detection block 150 may include 2 or more photon detection cells 100 arranged in a square, rectangle, polygonal shape, or the like. For instance, in another example, a square shape having dimensions of 5×5 or less is utilized for photon detection block 150 in accordance with the teachings of the present invention.

Continuing with the example illustrated in FIG. 1B, an input of block readout circuit 160 is coupled to photon detection block 150 via the output 155 of photon detection block 150. It is noted that in the example depicted in FIG. 1B, block readout circuit 160 is coupled to a single photon detection block 150. It is appreciated that in other examples, block readout circuit 160 may be coupled to two or more photon detection blocks 150 in accordance with the teachings of the present invention.

As previously mentioned in the depicted example, the photon detector outputs 130 from each photon detection cell 100 in a photon block 150 are coupled together in parallel to an input of block readout circuit 160 with a through-silicon via (TSV) 154 and photon detection block output 155. As shown in the depicted example, block readout circuit 160 includes grounding element 161, a first amplifier 162, a comparator 163, a logic block 164 and a second amplifier 165. As shown in the depicted example, grounding element 161 is coupled between photon detection block output 155 and ground. The input of first amplifier 162 is also coupled to photon detection block output 155. The output of first amplifier 162 is coupled to comparator 163 and is compared with a threshold level TH 166 to determine whether a photon pulse input is detected. The output of comparator 163 is coupled to logic block 164. In one example, logic block 164 generates a digital output $D_{OUT}$ 167 of photon detection block 150 in response to signal processing of the output of comparator 163. In one example, logic block 164 includes an analog-to-digital converter circuit and a time-to-digital converter to determine in response to the output of comparator 163 the time at which a photon pulse input is detected in accordance with the teachings of the present invention.

As shown in the depicted example, an input of second amplifier 165 is coupled to the output of first amplifier 162 and provides an analog amplified output $A_{OUT}$ 168 of photon detection block 150. In various examples, the output of second amplifier 165, $A_{OUT}$ 168, may be used for on-chip or off-chip analog processing. In one example, grounding element 161 may be a resistor. In other examples, grounding element 161 may be coupled to a voltage other than ground. In yet other examples, ground element 161 is optional and may be omitted.

FIG. 2 is a three-dimensional image showing the placement of an example stacked-chip SiPM 200 with delay equalization in accordance with the teachings of the present invention. As shown in the depicted example, stacked-chip SiPM 200 includes first wafer 210, second wafer 220, and interconnect wafer 230 stacked between the first wafer 210 and second wafer 220 as shown. In the illustrated example first wafer 210 includes a plurality of photon detection blocks 211 and 212. In one example, first wafer 210 is a backside illuminated (BSI) wafer. Thus, each one of the plurality of photon detection blocks 211 and 212 is illuminated through a backside of first wafer 210. Second wafer 220 includes a plurality of block readout circuits 221 and 222. It is noted that for the sake of simplicity, only two photon detection blocks 211 and 212 and two block readout circuits 221 and 222 are illustrated in stacked-chip SiPM 200 of FIG. 2 and that other examples may include hundreds or thousands of photon detection blocks and block readout circuits in accordance with the teachings of the present invention. In the illustrated example, each block readout circuit is coupled to one photon detection block. In other examples, it is appreciated that each block readout circuit may be coupled to two or more photon detection blocks in accordance with the teachings of the present invention.

As shown in the example illustrated in FIG. 2, the respective outputs of each of the photon detection blocks 211 and 212 are coupled to the respective inputs of corresponding block readout circuits 221 and 222 via conductors 231 and 232 respectively via interconnect wafer 230. In one example, conductors 231 and 232 include metal. As shown in the example, the conductors 231 and 232 all have substantially equal metal lengths. Accordingly, signal propagation delays between the outputs of each one of the plurality of photon detection blocks 211 and 212 and the inputs of each one of the plurality of block readout circuits 221 and 222 are substantially equal in accordance with the teachings of the present invention. Therefore, propagation delay equalization in stacked-chip SiPM 200 is achieved by arranging the metal interconnects in the interconnect wafer 230 between the photon detection blocks of the first wafer 210 and the block readout circuits of the second wafer 220 such that the lengths of the conductors 231 and 232 from each photon detection cell in photon detection blocks 211 and 212 to their respective block readout circuits 221 and 222 are substantially equal in accordance with the teachings of the present invention.

Figure 3:
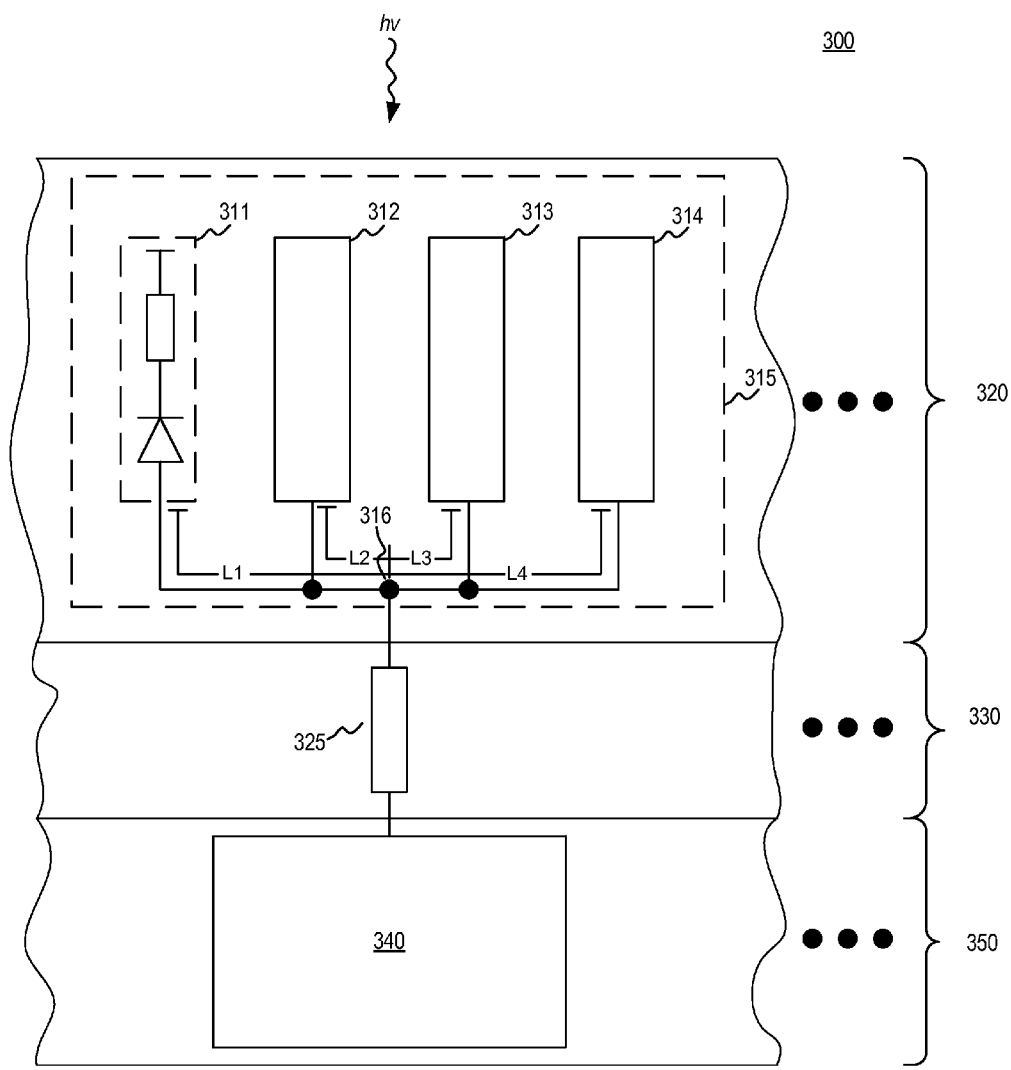
FIG. 3 is a schematic showing an example cross-section representation of a portion of an example stacked-chip SiPM in accordance with the teachings of the present invention.

FIG. 3 is a schematic showing an example cross-section representation of a portion of an example stacked-chip SiPM 300 in accordance with the teachings of the present invention. In the depicted example, a partition of stacked-chip SiPM 300 illustrated in FIG. 3 includes a photon detection block 315 fabricated on a first wafer 320. In the depicted example, photon detection block 315 is illustrated as including only four photon detection cells 311, 312, 313, and 314 for simplicity. It is appreciated that in other examples, photon detection block 315 included in stacked-chip SiPM 300 may include an array of sixteen photon detection cells arranged in a 4×4 square shape. In other examples, each photon detection block 315 may included two or more photon detection cells arranged in a square, rectangular, polygonal shape, or the like, such as for example a square shape having dimensions 5×5 or less.

The example shown in FIG. 3 illustrates a node 315, which represents an interconnect point between first wafer 320 and interconnect wafer 330. As mentioned previously, interconnect wafer 330 includes an arrangement of vias and/or metal interconnects that may be stacked to provide one or more electrical connections 325 coupled between photon detection block 315 fabricated on first wafer 320 and block readout circuit 340 fabricated on second wafer 350 in accordance with the teachings of the present invention. In the example, the length of the metal interconnect between the output of photon detection cell 311 and node 316 is equal to L1. Similarly, the respective lengths of the metal interconnects between the outputs of photon detection cells 312, 313, and 314 and node 316 are equal to L2, L3, and L4, respectively. It is appreciated that although the metal interconnects between the outputs of photon detection cells 311, 312, 313, and 314 and node 316 are not necessarily drawn to scale in FIG. 3, the lengths L1, L2, L3, and L4 are all substantially equal to each other in accordance with the teachings of the present invention. As such, there are substantially no differences in propagation delays between the photon detection cells 311, 312, 313, and 314 in the first wafer 320 and the corresponding block readout circuit 340 in second wafer 350 through the interconnect wafer 330, which therefore increases the timing resolution of SiPM 300 in accordance with the teachings of the present invention.

In addition, it is appreciated that in the illustrated example there are additional partitions of the stacked-chip SiPM 300 that are substantially similar to the example partition illustrated in FIG. 3. Thus, each of the other substantially similar partitions also include counterpart metal interconnects having lengths substantially equal to L1, L2, L3, and L4 such that there are substantially no differences in propagation delays between the respective photon detection cells of the other substantially similar partitions in the first wafer 320 and the corresponding block readout circuits in second wafer 350 through the interconnect wafer 330 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A photon detection device, comprising:
   a first wafer having an array of photon detection cells partitioned into a plurality of photon detection blocks arranged in the first wafer;
   a second wafer having a plurality of block readout circuits arranged thereon; and
   an interconnect wafer disposed between the first wafer and the second wafer, wherein the interconnect wafer includes a plurality of conductors having substantially equal lengths, wherein each one of the plurality of conductors is coupled between a corresponding one of the plurality of photon detection blocks in the first wafer and a corresponding one of the plurality of block readout circuits such that signal propagation delays between each one of the plurality of photon detection blocks and each one of the plurality of block readout circuits are substantially equal.

2. The photon detection device of claim 1 wherein each one of the plurality of conductors in the interconnect wafer has a substantially equal metal length.

3. The photon detection device of claim 1 wherein each one of the plurality of photon detection blocks includes a through silicon via (TSV) coupled to a respective output of each one of the plurality of photon detection blocks.

4. The photon detection device of claim 1 wherein each one of the plurality of photon detection blocks includes a plurality of metal interconnects having substantially equal length that are coupled between each one of the photon detection cells and a respective output of each one of the plurality of photon detection blocks.

5. The photon detection device of claim 1 wherein each one of the photon detection cells comprises a photon detection region coupled to a quenching element.

6. The photon detection device of claim 1 wherein each one of the photon detection cells comprises a single photon avalanche diode (SPAD) coupled to a quenching element.

7. The photon detection device of claim 1 wherein the first wafer is a backside illuminated (BSI) wafer such that each one of the plurality of photon detection blocks is illuminated through a backside of the first wafer.

8. The photon detection device of claim 1 wherein each one of the plurality of block readout circuits comprises:
   a first amplifier having an input coupled to a respective one of the plurality of photon detection blocks from the first wafer; and
   a comparator coupled to compare an output of the first amplifier with a threshold level to determine whether a photon pulse input is detected.

9. The photon detection device of claim 8 wherein each one of the plurality of block readout circuits further comprises a logic block coupled to an output of the comparator to generate a digital output.

10. The photon detection device of claim 9 wherein the logic block comprises an analog-to-digital converter circuit coupled to a time-to-digital converter to determine in response to the output of comparator a time at which the photon pulse input is detected.

11. The photon detection device of claim 1 wherein each one of the plurality of block readout circuits comprises a second amplifier coupled to an output of the first amplifier to provide an analog amplified output.

12. A stacked silicon photomultiplier, comprising:
   an array of photon detection cells partitioned into a plurality of photon detection blocks disposed on a first wafer;

a plurality of block readout circuits disposed in a second wafer stacked proximate to the first wafer; and a plurality of conductors having substantially equal lengths, wherein each one of the plurality of conductors is coupled between an output of a respective one of the plurality of photon detection blocks on the first wafer and an input of a respective one of the plurality of block readout circuits disposed in the second wafer such that signal propagation delays between each one of the plurality of photon detection blocks and each one of the plurality of block readout circuits are substantially equal.

13. The stacked silicon photomultiplier of claim 12 further comprising an interconnect wafer stacked between the first wafer and the second wafer, wherein the plurality of conductors are included in the interconnect wafer.

14. The stacked silicon photomultiplier of claim 12 wherein each one of the plurality of photon detection blocks includes a through silicon via (TSV) coupled to a respective output of each one of the plurality of photon detection blocks.

15. The stacked silicon photomultiplier of claim 12 wherein each one of the plurality of photon detection blocks includes a plurality of metal interconnects having substantially equal lengths that are coupled between each one of the photon detection cells and an output of the respective one of the plurality of photon detection blocks on the first wafer.

16. The stacked silicon photomultiplier of claim 12 wherein each one of the photon detection cells comprises a photon detection region coupled to a quenching element.

17. The stacked silicon photomultiplier of claim 12 wherein each one of the photon detection cells comprises a single photon avalanche diode (SPAD) coupled to a quenching element.

18. The stacked silicon photomultiplier of claim 12 wherein the first wafer is a backside illuminated (BSI) wafer such that each one of the plurality of photon detection blocks is illuminated through a backside of the first wafer.

19. The stacked silicon photomultiplier of claim 12 wherein each one of the plurality of block readout circuits comprises:

a first amplifier having an input coupled to a respective one of the plurality of photon detection blocks from the first wafer; and a comparator coupled to compare an output of the first amplifier with a threshold level to determine whether a photon pulse input is detected.

20. The stacked silicon photomultiplier of claim 19 wherein each one of the plurality of block readout circuits further comprises a logic block coupled to an output of the comparator to generate a digital output.

21. The stacked silicon photomultiplier of claim 20 wherein the logic block comprises an analog-to-digital converter circuit coupled to a time-to-digital converter to determine in response to the output of comparator a time at which the photon pulse input is detected.

22. The stacked silicon photomultiplier of claim 12 wherein each one of the plurality of block readout circuits comprises a second amplifier coupled to an output of the first amplifier to provide an analog amplified output.

* * * * *